(12) United States Patent
Otremba et al.

(10) Patent No.: US 7,589,413 B2
(45) Date of Patent: Sep. 15, 2009

(54) SEMICONDUCTOR DEVICE COMPRISING A VERTICAL SEMICONDUCTOR COMPONENT AND METHOD FOR PRODUCING THE SAME

(75) Inventors: Ralf Otremba, Kaufbeuren (DE); Xaver Schloegel, Sachsenskam (DE); Josef Hoeglauer, Munich (DE)

(73) Assignee: Infineon Technologies AG, Munich (DE)

(*) Notice: Subject to any disclaimer, the term of this patent is extended or adjusted under 35 U.S.C. 154(b) by 397 days.

(21) Appl. No.: 11/611,498

(22) Filed: Dec. 15, 2006

(65) Prior Publication Data
US 2007/0138634 A1    Jun. 21, 2007

(30) Foreign Application Priority Data
Dec. 19, 2005    (DE)    ......... 10 2005 061 015

(51) Int. Cl.
*H01L 23/488*    (2006.01)
(52) U.S. Cl. .............. 257/693; 257/E23.023
(58) Field of Classification Search ........... 257/138, 257/676, 664, 693, 777, 727, 706, 678, 723, 257/E21.506, E21.419, 288, 318; 361/760, 361/106
See application file for complete search history.

(56) References Cited

U.S. PATENT DOCUMENTS

| | | | | |
|---|---|---|---|---|
| 5,139,972 A | 8/1992 | Neugebauer et al. | ........ | 433/209 |
| 5,620,904 A | 4/1997 | Hanoka | ........ | 438/98 |
| 6,255,672 B1 * | 7/2001 | Yoshioka et al. | ........ | 257/107 |
| 6,624,522 B2 | 9/2003 | Standing et al. | ........ | 257/782 |
| 6,841,865 B2 | 1/2005 | Standing | | |
| 7,301,235 B2 * | 11/2007 | Schaffer et al. | ........ | 257/724 |
| 2005/0121795 A1 | 6/2005 | Mauder | ........ | 257/762 |
| 2007/0215997 A1 * | 9/2007 | Standing | ........ | 257/678 |
| 2008/0036078 A1 * | 2/2008 | Herbsommer et al. | ........ | 257/727 |
| 2008/0111232 A1 * | 5/2008 | Pavier | ........ | 257/711 |
| 2008/0230152 A1 * | 9/2008 | Standing | ........ | 148/24 |

FOREIGN PATENT DOCUMENTS

| | | |
|---|---|---|
| DE | 691 20 066 T2 | 12/1996 |
| DE | 103 51 028 B4 | 9/2005 |
| EP | 0528001 | 9/1992 |
| WO | 92/16018 | 9/1992 |
| WO | 02093645 | 1/2002 |

OTHER PUBLICATIONS

Examination Report for DE102005061015.3-33 dated Sep. 19, 2006, 5 pages.
Examination Report for DE102005061015.3-33 dated May 4, 2007, 3 pages.

\* cited by examiner

*Primary Examiner*—Nathan W Ha
(74) *Attorney, Agent, or Firm*—Banner & Witcoff, Ltd

(57) ABSTRACT

A semiconductor device (1; 25) has a vertical semiconductor component (2), a first metalization (8) and a second metalization (13). The second metalization (13) has an integral film with a first end (14) with a first contact area (17), an intermediate region (15) and a second end (16) with a second contact area (19). The first contact area (17) is arranged on the rear side (6) of the semiconductor component (2) and the second contact area (19) is essentially arranged in the plane of the external contact area (12) of the first metalization (8) and provides an external contact area (12). The first contact area (17) and the second contact area (19) are arranged on opposite surfaces of the film of the second metalization (13).

29 Claims, 2 Drawing Sheets

US 7,589,413 B2

SEMICONDUCTOR DEVICE COMPRISING A VERTICAL SEMICONDUCTOR COMPONENT AND METHOD FOR PRODUCING THE SAME

RELATED APPLICATION

This application claims priority from German Patent Application No. DE 10 2005 061 015.3, which was filed on Dec. 19, 2005, and is incorporated herein by reference in its entirety.

TECHNICAL FIELD

The invention relates to a semiconductor device comprising a vertical semiconductor component and a method for producing the same.

BACKGROUND

Vertical semiconductor components, in particular power transistors such as MOSFETs, are typically provided as a component of a housed device mounted on a printed circuit board by the customer. A maximally cost-effective production and space-saving mounting of the device are to be provided since said devices are used in a large volume in switch mode power supplies, in the case of which there is a great cost pressure. Furthermore, the heat dissipation of the device is to be improved since inadequate heat dissipation can lead to unreliability and to failure of the device.

A device comprising a vertical semiconductor component is disclosed in U.S. Pat. No. 6,624,522, in the case of which the top side of the device can be cooled. The front side of the semiconductor component has a source electrode and gate electrode that are mounted directly on the superordinate printed circuit board. The top side of the semiconductor component has a metallic well serving as drain electrode and also cooling linking area.

Consequently, said device has the advantage that the inner rewiring of the device is simplified since no bonding wires are used. Furthermore, the top side of the device can be cooled since the drain contact element forms the top side of the device. However, the device in U.S. Pat. No. 6,624,522 has the disadvantages that it is complicated and consequently expensive to produce and is unreliable in the event of loading due to moisture and thermal cycling since no plastic housing is provided.

SUMMARY

According to an embodiment, a semiconductor device may comprise a vertical semiconductor component comprising a front side with at least one first electrode area and a rear side with at least one second electrode area, a first metalization arranged on the first electrode area of the semiconductor component, the outer surface of said first metalization providing an external contact area of the semiconductor device, a second metalization comprising an integral film with a first end with a first contact area, an intermediate region and a second end with a second contact area, the first contact area being arranged on the second electrode area of the semiconductor component, and the second contact area essentially being arranged in the plane of the external contact area of the first metalization and providing an external contact area, wherein the first contact area and the second contact area are arranged on opposite surfaces of the film of the second metalization.

BRIEF DESCRIPTION OF THE DRAWINGS

The invention will now be explained in more detail with reference to the accompanying figures.

DETAILED DESCRIPTION

Figure 1:
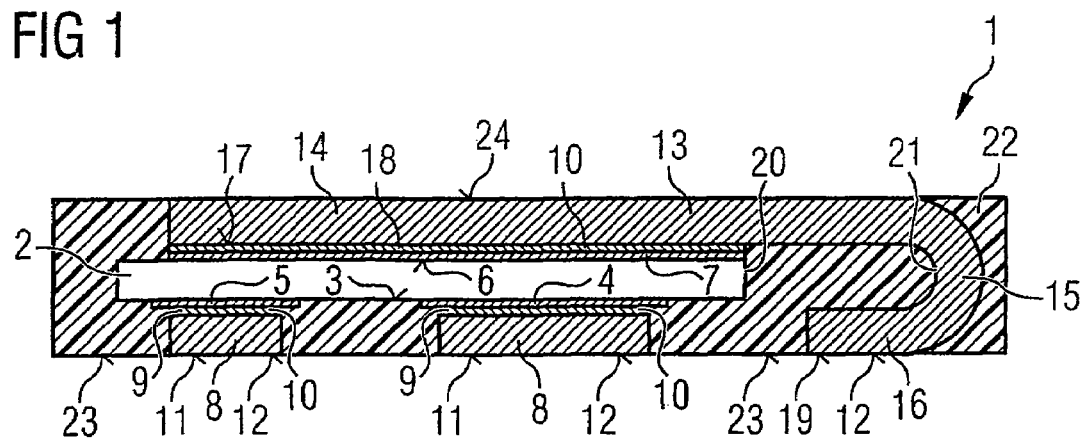
FIG. 1 shows a semiconductor device comprising a vertical semiconductor component according to a first embodiment.

According to an embodiment, a semiconductor device comprises a vertical semiconductor component, a first metalization and a second metalization. The vertical semiconductor component has a front side with at least one first electrode area and a rear side with at least one second electrode area. The first metalization is arranged on the first electrode area of the semiconductor component and the outer surface of said first metalization provides an external contact area of the semiconductor device.

The second metalization comprises an integral film. Said film has a first end with a first contact area, an intermediate region and a second end with a second contact area. The first end is connected to the second end via the intermediate region. The first contact area of the first end of the second metalization is arranged on the second electrode area of the semiconductor component. The second contact area of the second end of the second metalization is essentially arranged in the plane of the external contact area of the first metalization and provides an external contact area. According to an embodiment, the first contact area and also the second contact area are arranged on the opposite surfaces of the film of the second metalization.

The second metalization film enables the electrical contact-connection of the second electrode area from the opposite side of the device. The external contact areas of the device according to an embodiment are thus arranged in one plane, which form the underside of the device after the device has been mounted on a printed circuit board. The device according to an embodiment can thus be mounted on the superordinate printed circuit board in a simple manner.

According to an embodiment, the second metallization, thus, comprises an integral metal film formed in the device in such a way that the metal film is bent around the semiconductor component. According to an embodiment, the second metalization film thus has an internal angle of approximately 180°.

This form of contact-connection has the advantage that it is simple to produce since the film itself consists of one piece. No further processing of the film is necessary. In contrast thereto, in the case of a contact well, the dimensions of the contact well are adapted precisely to the semiconductor component by means of a complicated processing of the basic material. Furthermore, the external surfaces of the contact clip are processed precisely, since they form the exterior side of the device and also the external contact areas. The processing of the basic material can limit the reduction of the thickness of the contact clip and consequently the size of the device. These disadvantages are avoided in the case of the metalization film according to an embodiment and the arrangement of the metalization film in the device.

A further advantage of the second metalization film according to an embodiment is that the film can be mounted on the device in a simple manner since the film extends or is bent around the semiconductor component.

According to an embodiment, the first end of the film, said first end forming the second metalization, is arranged on the top side of the device. According to an embodiment, the upper side of the first end forms a part of the top side of the device and provides a coolable top side of the device. The heat dissipation of the device according to an embodiment can be improved further by mounting an additional heat sink on the first end of the second metalization.

In one embodiment, the intermediate region of the second metalization projects beyond an edge side of the semiconductor component and extends around the edge side of the semiconductor component. Consequently, the inner surface of the intermediate region is not in direct contact with the edge side of the semiconductor component. As a result, short circuits with the semiconductor body of the semiconductor component are avoided and the insertion of the second metalization into the device is simplified.

In one embodiment, the intermediate region and the second end of the second metalization are arranged alongside an edge side of the semiconductor component. Consequently, the external contact area of the second metalization is not arranged below the semiconductor component, but rather alongside the semiconductor component. This arrangement has the advantage that the arrangement of the external contact areas on the underside of the device can be established as desired. This enables simpler mounting for the customer.

In one embodiment, the intermediate region of the second metalization essentially has an arcuate shape. This shape has the advantage that it can be produced in a simple manner and the mechanical stress is distributed equally over the intermediate region.

According to an embodiment, the first metalization may be electrically connected to the first electrode area via a diffusion solder connection and/or the second metalization may be electrically connected to the second electrode area via a diffusion solder connection.

According to an embodiment, the diffusion solder connection may have Au and Sn, Ag and Sn, Cu and Sn, Ag and In, AuSn, AgSn, CuSn or AgIn. An AuSn-based diffusion solder has a melting point or production temperature of approximately 280° C., AgSn of approximately 221° C. and AgIn of approximately 141° C. A diffusion solder has the advantage that the diffusion solder connection produced has a higher melting point than the temperature at which it was produced. Consequently, the mounting can be carried out at a low temperature at which a thermally stable connection is produced.

Diffusion solders having lower melting points have the advantage that loading on the metalization film and the semiconductor component is reduced during the soldering method. The contact-connection method thus becomes stabler and more reliable.

According to an embodiment, the intermediate region of the second metalization may furthermore have means for providing the arcuate shape. The mechanical loading on the second metalization and the connections produced thereby is reduced as a result, and a reliable electrical contact-connection is made possible. In one embodiment, the means for providing the arcuate shape comprise a plurality of holes and/or mounting lugs. The means for providing the arcuate shape may comprise at least one depression in the inner side of the intermediate region, the depressions extending over the width of the intermediate region.

According to an embodiment, the semiconductor device may furthermore comprise a plastic housing composition encapsulating at least the semiconductor component.

According to an embodiment, the external contact areas of the first metalization and the second metalization preferably remain free of the plastic housing composition, with the result that a reliable electrical connection with a low electrical resistance is produced.

In one embodiment, the upper side of the first end of the second metalization remains free of the plastic housing composition and forms at least one part of the top side of the semiconductor device. This embodiment has the advantage that the first end of the second metalization can be used as cooling linking area since the metalization is in thermal contact with the surroundings. Furthermore, an additional heat sink may be mounted directly on this uncovered region of the second metalization in order to shorten the thermal resistance path.

In an alternative embodiment, an electrically insulating film is arranged on the first end of the second metalization. This arrangement has the advantage that the top side of the second metalization has an electrical insulation layer. A metallic or electrically conductive heat sink can thus be mounted onto this electrically insulated metalization without impairing the functionality of the semiconductor component.

The top side of the electrically insulating film may remain free of the plastic housing composition and form at least one part of the top side of the semiconductor device. The thickness of the device is therefore not enlarged.

According to an embodiment, the vertical semiconductor component may be a vertical transistor. In this case, the front side of the semiconductor component furthermore has at least one control electrode area, the first metalization being arranged on the first electrode area and on the control electrode area. According to an embodiment, the first metalization region arranged on the control electrode area is not in contact with the region of the first metalization that is arranged on the first contact electrode area. In this embodiment, the first metalization has two or more separate regions whose size and arrangement correspond to the size and arrangement of the first electrode area and control electrode area.

According to an embodiment, the vertical transistor may be a power transistor and may be a MOSFET (Metal Oxide Semiconductor Field Effect Transistor), an IGBT (Isolated Gate Bipolar Transistor) or a BJT (Bipolar Junction Transistor).

In the case of a MOSFET power semiconductor component, the first electrode is a source electrode, the control electrode is a gate electrode and the second electrode is a drain electrode. In the case of an IGBT power semiconductor component, the first electrode is an emitter electrode, the control electrode is a gate electrode and the second electrode is a collector electrode. In the case of a BJT power semiconductor component, the first electrode is an emitter electrode, the control electrode is a base electrode and the second electrode is a collector electrode.

In a further embodiment, the vertical semiconductor component is a diode having an anode as first electrode area and a cathode as second electrode area.

In an embodiment of a method for producing a semiconductor device, firstly a semiconductor component is provided, having a front side with at least one first electrode area and a rear side with at least one second electrode area.

A carrier film is also provided, comprising an electrically insulating film and a structured metal layer. The structured metal layer is arranged on one side of the electrically insulating film and provides a first metalization and a second metalization. The second metalization comprises an integral film with a first end, an intermediate region and a second end. The second end of the second metalization is arranged alongside the first metalization.

The first metalization is applied on the first electrode area and is mechanically and electrically connected to the first electrode area.

The first end of the second metalization is applied on the second electrode area of the rear side of the semiconductor component and is mechanically and electrically connected to the second electrode area. The second end of the second metalization is essentially arranged in the plane of the first metalization.

The electrically insulating film of the carrier film is removed at least from the first metalization and the second end of the second metalization with external contact areas being uncovered. The uncovered outer surfaces of the first metalization and of the second end of the second metalization thus form the external contact areas of the semiconductor device.

The method according to an embodiment has the advantage that the metalization of the front side and of the rear side of the semiconductor component is produced by means of a single carrier film with a corresponding structured metal layer. On account of the form of the second metalization according to an embodiment, the rewiring of the rear side metalization to the opposite side of the device is produced simultaneously, since the second metalization extends from the rear side as far as the front side of the semiconductor component. According to an embodiment, the uncovered end of the second rear side metalization is essentially arranged in the plane of the front side metalization, so that the rear side is electrically accessible from the opposite side of the semiconductor component. The outer surfaces of the front side metalization and of the uncovered end of the second metalization thus form the external contact area of a surface-mountable device.

In one embodiment, the carrier film is bent around an edge side of the semiconductor component. The intermediate region of the second metalization thus has an internal angle of approximately 180°. The first end and the second end of the second metalization are arranged in parallel planes.

According to an embodiment, the carrier film may firstly be applied either on the front side or on the rear side. Consequently, either the first or the second metalization may firstly be connected to the semiconductor component.

In one form of implementation, at least the semiconductor component is embedded in a plastic housing composition in order that the semiconductor component is protected from the environment, in particular from moisture. The encapsulation or encasement by injection molding is advantageously carried out prior to the removal of the electrically insulating film of the carrier film, since the electrically insulating film protects the external contact areas from the plastic housing composition.

In one form of implementation, the electrically insulating film of the carrier film is completely removed from the first metalization and second metalization. In a further form of implementation, the electrically insulating film is removed only from the first metalization and the second end of the second metalization. Consequently, the electrically insulating film is arranged on the first end and partly on the intermediate region of the second metalization. This arrangement has the advantage that additional insulation of the first end of the second metalization is not required.

In one form of implementation, the carrier film is connected to the semiconductor component in two separate steps. The first metalization is electrically connected to the first electrode area by means of a diffusion solder during a first soldering method and the second metalization is electrically connected to the second electrode area by means of a diffusion solder during a second soldering method. This form of implementation has the advantage that firstly a mechanically stable connection to one side of the semiconductor component is produced and then the carrier film is deformed in order to produce the rewiring to the opposite side.

In an alternative form of implementation, a single diffusion soldering method is carried out and the first metalization is electrically connected to the first electrode area by means of a diffusion solder and the second metalization is electrically connected to the second electrode area by means of a diffusion solder during one soldering method.

The diffusion soldering method may be effected by pressing in the metalization on a heated semiconductor component. This method is advantageously used if the metalization is connected on the front side and on the rear side in one method step.

Means for providing an arcuate shape may be provided in the intermediate region of the second metalization. The means are provided in the carrier film prior to the mounting method. The means reduce the stress in the second metalization that is caused by the reshaping or bending of the carrier film.

According to an embodiment, a plurality of holes and/or mounting lugs and/or at least one depression in the surface of the intermediate region may be provided as means for providing an arcuate shape. According to an embodiment, the depressions extend over the width of the intermediate region and provide means that involve making it possible to take up the reduction of the surface of the bent inner side of the intermediate region. According to an embodiment, the depressions are formed in the uncovered surface of the intermediate region of the second metalization of the carrier film which forms the inner surface of the second metalization after the reshaping.

According to an embodiment, the electrically insulating film of the carrier film may be removed by means of laser radiation. According to an embodiment, the electrically insulating film is removed after the encasing application of the plastic housing composition by injection molding. This has the advantage that the electrically insulating film serves as a protective film in order that the outer surfaces of the metalization are not contaminated by the plastic housing composition.

FIG. 1 shows a cross section of a semiconductor device 1 according to a first embodiment. The semiconductor device 1 comprises a vertical semiconductor component 2, which is a vertical power MOSFET in this embodiment.

The front side 3 of the semiconductor component 2 has a source electrode area 4 and a gate electrode area 5. The rear side 6 of the semiconductor component 2 has a drain electrode area 7. Two regions of a first metalization 8 are respectively arranged on the source electrode area 4 and the gate electrode area 5. The first metalization 8 has copper and has a thickness of approximately 50 μm.

The two regions of the first metalization 8 are mechanically and electrically connected to the source electrode area 4 and gate electrode area 5, respectively, in each case via a diffusion solder connection 9. The diffusion soldering connection 9 has intermetallic phases 10, which are the product of a reaction between a diffusion solder and the material of the electrode areas of the first metalization. In this embodiment, the intermetallic phases comprise Ag and Sn and/or Au and Sn.

The outer surfaces 11 of the first metalization 8 form external contact areas 12 of the semiconductor device 1. The outer surfaces 11 of the first metalization 8 are thus arranged on the underside of the semiconductor device 1. Consequently, the front side 3 of the semiconductor component is arranged toward the bottom if the semiconductor device 1 is mounted on a printed circuit board (not shown). The rear side 6 of the semiconductor component is thus directed toward the top.

The semiconductor device 1 furthermore comprises a second metalization 13. The second metalization 13 comprises the form of a film or a strip composed of a film and has a first end 14, an intermediate region 15 and a second end 16. The second metalization film 13 has a thickness of approximately 50 μm and has copper. The first end 14 has a contact area 17, which is mechanically and electrically connected on the drain electrode area 7 by way of a diffusion soldering connection 18. The diffusion soldering connection 18 has intermetallic phases with Ag and Sn and/or Au and Sn.

The intermediate region 15 of the second metalization is bent around an edge side 20 of the vertical semiconductor component 2 and the second end 16 of the second metalization 13 is essentially arranged in the plane of the first metalization 8.

The intermediate region 15 thus has an arcuate shape that is arranged at a distance from the edge side 20 of the semiconductor component 2. The inner surface 21 of the intermediate region 15 has an internal angle of approximately 180° and is arranged at a distance from the edge side 20. The second end 16 and the first end 14 of the second metalization 13 are thus arranged in parallel planes.

The second end 16 of the second metalization 13 has a second contact area 19, which provides an external contact area 12 of the semiconductor device 1. Consequently, the second contact area 19 is essentially arranged in the plane of the external surface 11 of the first metalization 8. Said second contact area 19 and the first contact area 17 are thus arranged on the opposite surface of the film of the second metalization 13.

The semiconductor device 1 furthermore comprises a plastic housing composition 22 encapsulating the semiconductor component 2. The underside 23 of the plastic housing composition 22 forms a common surface 23 with the external contact areas 12 of the first metalization 8 and the second metalization 13. In this embodiment, the intermediate region 15 of the second metalization 13 is embedded in the plastic housing composition 22. The upper surface 24 of the first end 14 of the second metalization 13 remains free of the plastic housing composition 22 and forms a part of the top side of the semiconductor device 1. This uncovered region 24 of the second metalization 13 provides a cooling linking area on which an additional heat sink (not shown here) can be mounted.

The second end 16 of the second metalization 13 is arranged alongside the edge side 20 of the semiconductor component 2 and is electrically insulated from the semiconductor component 2 by means of the plastic housing composition 22.

Figure 2:
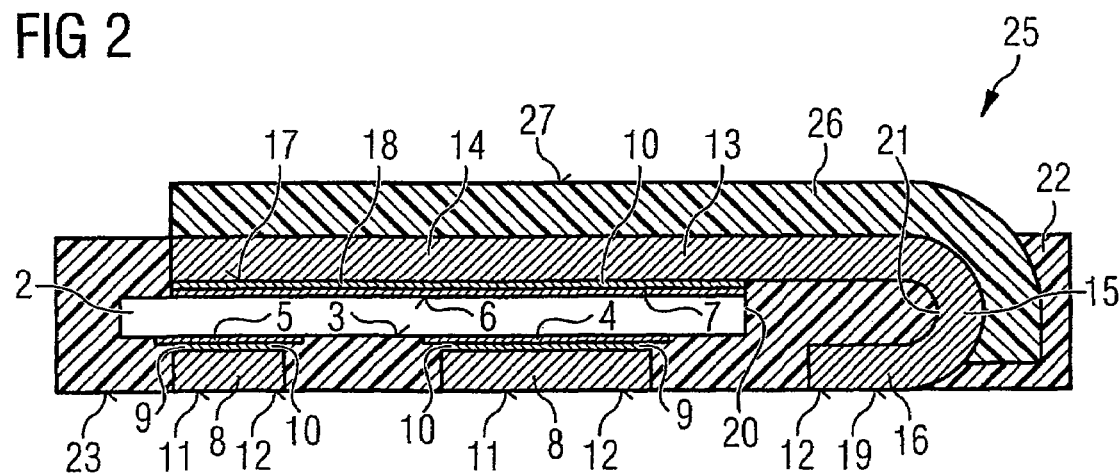
FIG. 2 shows a semiconductor device comprising a vertical semiconductor component according to a second embodiment.

FIG. 2 shows a semiconductor device 25 according to a second embodiment. Identical components are designated by identical reference symbols and are not explained any further.

The second semiconductor device 25 in FIG. 2 differs from the first semiconductor device 1 in FIG. 1 by virtue of an electrically insulating film 26 arranged on the top side 24 of the first end 14 and on the outer surface of the intermediate region 15 of the second metalization 13. The electrically insulating film 26 has polyimide. The upper surface 27 of the region of the electrically insulating film 26 which is arranged above the semiconductor component 2 is free of the plastic housing composition 22 and forms a part of the top side of the semiconductor device 25. This uncovered surface 27 of the electrically insulating film 26 also provides a cooling linking area. In this embodiment, the cooling linking area 27 is electrically insulated from the second metalization 13 and from the drain electrode area 7 by the film 26. This arrangement simplifies the mounting of a heat sink on the top side of the semiconductor device 25 by the customer since no additional insulation is required.

Figure 3:
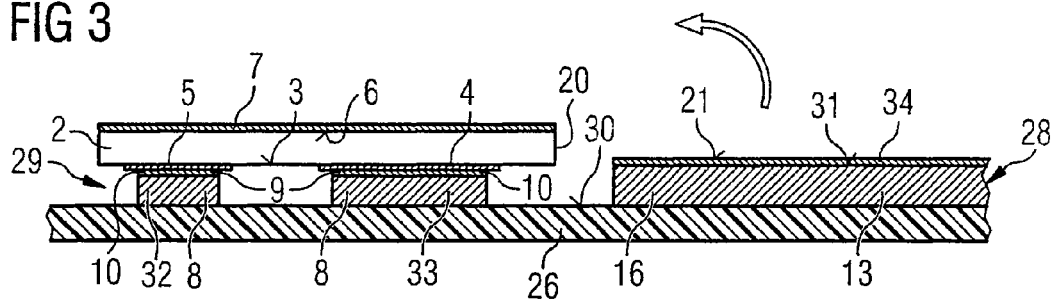
FIG. 3 shows the mounting of a metalization on one side of the semiconductor device from FIGS. 1 and 2.

FIG. 3 shows a first step in the method for producing the semiconductor device from FIG. 1 and the semiconductor device 25 from FIG. 2.

A carrier film 28 is provided, comprising an electrically insulating film 26 and a structured metal film 29. The structured metal film 29 is arranged as a structured metal layer on a side 30 of the electrically insulating film 26. The metal film 29 has a thickness of approximately 50 um and provides the first metalization 8 and the second metalization 13 of the first semiconductor device 1 or of the second semiconductor device 25. The arrangement of the structured metal film 29 corresponds to the arrangement of the electrode areas of the semiconductor device 1, 25. The second end 16 of the second metalization 13 is arranged alongside the first metalization. In this exemplary embodiment, the second end 16 of the second metalization 13 is arranged alongside the source electrode metalization 8.

The top side 31 of the metal film 29 of the carrier film 28 has a diffusion solder layer 32, which forms intermetallic phases with the materials of the electrode area of the semiconductor device 1 or 25.

A vertical semiconductor component 2 is provided, having a source electrode area 4 and a gate electrode area 5 on one side 3 and a drain electrode area 7 on an opposite side 6. The semiconductor component 2 is applied on the carrier film 28, so that the gate electrode area 5 is arranged on the corresponding part of the first metalization 8 of the carrier film 28 and the source electrode area 7 is arranged on the corresponding part of the first metalization 8.

The semiconductor component 2 is heated to a temperature beforehand. The temperature is chosen such that when the front side 3 of the semiconductor component 2 is pressed in onto the first metalization 8 of the carrier film 28, intermetallic phases are produced in the boundary between the diffusion solder layer 34 of the first metalization 8 and the source electrode area 4 and the gate electrode area 5. Through the production of the intermetallic phases, the source electrode area 4 and the gate electrode area 5 of the semiconductor component 2 are mechanically and electrically connected to the first metalization and the carrier film 28.

In the next steps of the method according to an embodiment, the carrier film 28 is bent around the edge side 20 of the semiconductor component 2 and the second end 16 of the second metalization 13 is applied on the drain electrode area 7. This step can be seen in FIG. 5.

Figure 4:
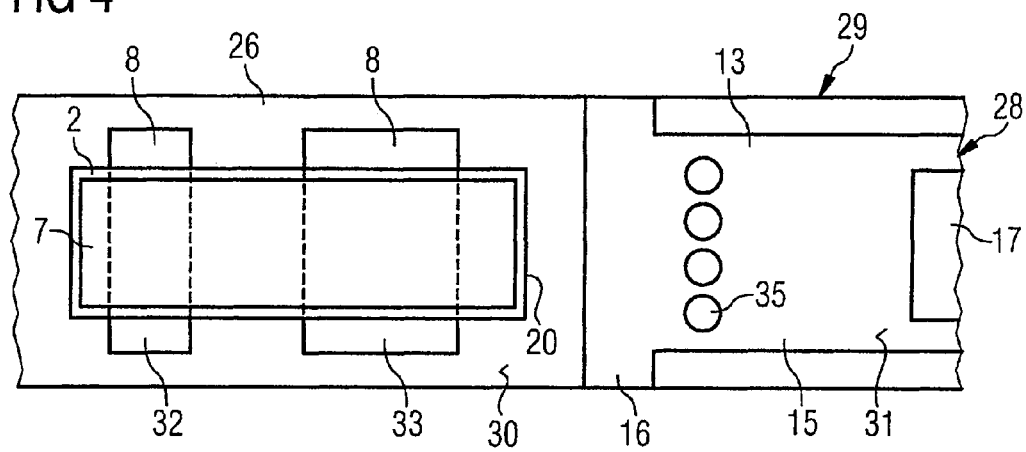
FIG. 4 shows a plan view of the method step from FIG. 3.

FIG. 4 shows a plan view of the method step from FIG. 3. The plan view reveals that the carrier film 28 has a strip form and the semiconductor component 2 is rectangular. The longitudinal sides of the semiconductor component 2 are arranged in the longitudinal direction of the carrier film 28. The first metalization 8 has two rectangular separate regions 32, 33, the longitudinal sides of which are arranged transversely with respect to the length of the carrier film 28. The gate electrode 5 is arranged on the first region 32 and the source electrode 4 is arranged on the second region 33 of the first metalization 8.

The second metalization 13 is essentially T-shaped, the cross of the T forming the second end 16 of the metalization 13, which is arranged alongside the semiconductor component 2 and extends over the width of the carrier film 28. The second end is connected to the first end of the second metalization 13 by way of an intermediate region 15. The projecting ends of the cross form mounting lugs of the second metalization 13, which serve to simplify the bending method. Four holes 35 are provided in a row in the intermediate region 15. The holes 35 are arranged transversely with respect to the longitudinal direction of the carrier film 28 and provide means for providing an arcuate shape of the second metalization 13.

The first end 14 arranged further away from the first metalization 8, has a contact area 17 provided for mounting on the drain electrode area 7.

Figure 5:
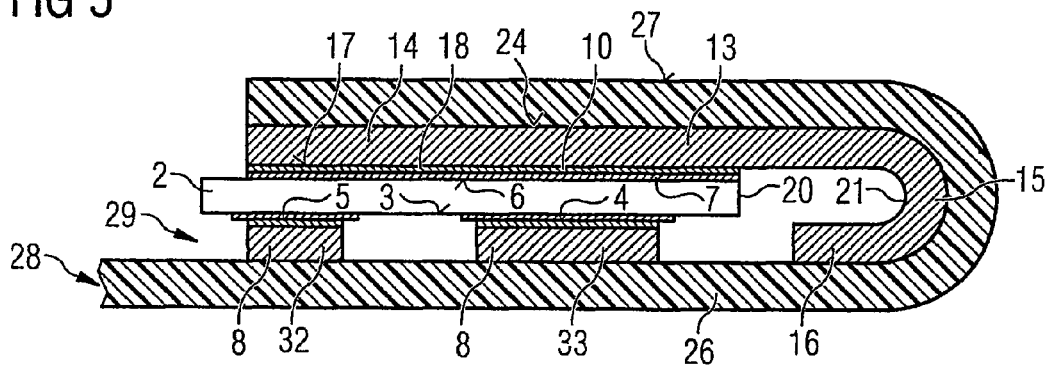
FIG. 5 shows the mounting of the metalization on the opposite side of the semiconductor device from FIG. 3.

FIG. 5 shows the semiconductor component 2 after the carrier film 28 has been bent around the edge side 20 of the semiconductor component 2. The contact-area 17 of the second metalization 13 is mounted on the drain electrode area 7 via a diffusion soldering connection 18. The intermediate region 15 has an arcuate shape.

In a further step (not shown), the semiconductor component 2 and also the first and second metalizations are embedded in a plastic housing composition 22. The carrier film 28 protects the outer surfaces of the first and second metalizations from the plastic housing composition 22.

After the encapsulation of the semiconductor component, the electrically insulating film 26 of the carrier film 28 is removed from the underside of the semiconductor device 1 by means of laser radiation. The outer surfaces 11, 19 of the first metalization 8 and of the second end 16 of the second metalization 13 are uncovered in order to provide external contact areas 12.

In order to produce the semiconductor device 1 of the first embodiment that can be seen in FIG. 1, the electrically insulating film 29 is completely removed from the first metalization 8 and the second metalization 13.

In order to produce the semiconductor device 25 from FIG. 2, the electrically insulating film 26 is removed only from the underside of the semiconductor device 25. The electrically insulating film 26 is removed from the first metalization 8 and from the second end 16 of the second metalization 13. The electrically insulating film remains on the second end of the second metalization and also on the outer surface of the intermediate region.

LIST OF REFERENCE SYMBOLS

1 First semiconductor device
2 Semiconductor component
3 Front side
4 Source electrode area
5 Gate electrode area
6 Rear side
7 Drain electrode area
8 First metalization
9 Diffusion solder connection
10 Intermetallic phases
11 Outer surfaces
12 External contact area
13 Second metalization
14 First end
15 Intermediate region
16 Second end
17 First contact area
18 Diffusion solder connection
19 Second contact area
20 Edge side
21 Inner surface
22 Plastic housing composition
23 Underside
24 Upper surface
25 Second semiconductor device
26 Electrically insulating film
27 Upper surface
28 Carrier film
29 Structured metal film
30 Top side of the electrically insulating film
31 Top side of the metal film
32 First region
33 Second region
34 Diffusion solder
35 Holes

What is claimed is:

1. A semiconductor device comprising:
a vertical semiconductor component comprising a front side with at least one first electrode area and a rear side with at least one second electrode area,
a first metalization arranged on the first electrode area of the semiconductor component, the outer surface of said first metalization providing an external contact area of the semiconductor device,
a second metalization comprising an integral film with a first end with a first contact area, an intermediate region and a second end with a second contact area, the first contact area being arranged on the second electrode area of the semiconductor component, and the second contact area essentially being arranged in the plane of the external contact area of the first metalization and providing an external contact area,
wherein
the first contact area and the second contact area are arranged on opposite surfaces of the film of the second metalization.

2. The semiconductor device according to claim 1, wherein the intermediate region of the second metalization projects beyond an edge side of the semiconductor component and extends around the edge side of the semiconductor component.

3. The semiconductor device according to claim 1, wherein the intermediate region and the second end of the second metalization are arranged alongside an edge side of the semiconductor component.

4. The semiconductor device according to claim 1, wherein the intermediate region of the second metalization essentially comprises an arcuate shape.

5. The semiconductor device according to claim 1, wherein the first metalization is electrically connected to the first electrode area via a diffusion solder connection and/or the second metalization is electrically connected to the second electrode area via a diffusion solder connection.

6. The semiconductor device according to claim 5, wherein the diffusion solder connection comprises Sn and one of Ag Cu or Ag and In.

7. The semiconductor device according to claim 4, wherein the intermediate region of the second metalization has means for providing the arcuate shape.

8. The semiconductor device according to claim 7, wherein the means for providing the arcuate shape comprise a plurality of holes and/or mounting lugs.

9. The semiconductor device according to claim 7, wherein the means for providing the arcuate shape comprise at least one depression in the inner side of the intermediate region, the depressions extending over the width of the intermediate region.

10. The semiconductor device according to claim 1, wherein the semiconductor device furthermore comprises a plastic housing composition encapsulating at least the semiconductor component.

11. The semiconductor device according to claim 10, wherein the external contact areas of the first metalization and of the second metalization remain free of the plastic housing composition.

12. The semiconductor device according to claim 10, wherein the upper side of the first end of the second metalization remains free of the plastic housing composition and forms at least one part of the top side of the semiconductor device.

13. The semiconductor device according to claim 1, wherein an electrically insulating film is arranged on the first end of the second metalization.

14. The semiconductor device according to claim 13, wherein the upper side of the electrically insulating film remains free of the plastic housing composition and forms at least one part of the top side of the semiconductor device.

15. The semiconductor device according to claim 1, wherein the vertical semiconductor component is a vertical transistor, and the front side of the semiconductor component furthermore comprises at least one control electrode area, the first metalization being arranged on the first electrode area and on the control electrode area.

16. The semiconductor device according to claim 15, wherein the vertical transistor is a power transistor.

17. The semiconductor device according to claim 15, wherein the vertical transistor is a MOSFET, an IGBT or a BJT.

18. The semiconductor device according to claim 1, wherein the vertical semiconductor component is a diode.

19. A method for producing a semiconductor device, comprising the steps of:
   providing a semiconductor component having a front side with at least one first electrode area and a rear side with at least one second electrode area,
   providing a carrier film comprising an electrically insulating film and a structured metal layer, the structured metal layer being arranged on one side of the electrically insulating film and providing a first metalization and a second metalization, the second metalization comprising an integral film with a first end, an intermediate region and a second end, and the second end of the second metalization being arranged alongside the first metalization,
   applying the first metalization on the first electrode area with production of a mechanical and electrical connection to the first electrode area,
   applying the first end of the second metalization on the second electrode area on the rear side of the semiconductor component with production of a mechanical and electrical connection to the second electrode area, the second end of the second metalization essentially being arranged in the plane of the first metalization,
   embedding at least the semiconductor component in a plastic housing composition, and
   removing the electrically insulating film of the carrier film from at least the first metalization and the second end of the second metalization with external contact areas being uncovered.

20. The method as claimed in claim 19, wherein the carrier film is bent around an edge side of the semiconductor component.

21. The method as claimed in claim 19, wherein the inner surface of the second metalization and the first metalization are embedded in the plastic housing composition.

22. The method as claimed in claim 19, wherein the electrically insulating film is completely removed from the first metalization and second metalization.

23. The method as claimed in claim 19, wherein the first metalization is electrically connected to the first electrode area during a first soldering method by means of a diffusion solder in the first soldering method and the second metalization is electrically connected to the second electrode area during a second soldering method by means of a diffusion solder.

24. The method as claimed in claim 19, wherein the first metalization is electrically connected to the first electrode area by means of a diffusion solder and the second metalization is electrically connected to the second electrode area by means of a diffusion solder during one soldering method.

25. The method as claimed in claim 19, wherein provision is made of means for providing an arcuate shape in the intermediate region of the second metalization.

26. The method as claimed in claim 25, wherein a plurality of holes and/or mounting lugs are provided as means for providing an arcuate shape.

27. The method as claimed in claim 25, wherein at least one depression in the surface of the intermediate region is provided as means for providing an arcuate shape, the depressions extending over the width of the intermediate region.

28. The method as claimed in claim 19, wherein the electrically insulating film of the carrier film is removed by means of laser radiation.

29. The method as claimed in claim 19, wherein the electrically insulating film of the carrier film is removed by means of etching.

* * * * *